United States Patent
Jo

(10) Patent No.: US 9,310,441 B2
(45) Date of Patent: Apr. 12, 2016

(54) APPARATUS AND METHOD FOR ESTIMATING STAGE OF CHARGE OF BATTERY

(71) Applicant: LG CHEM, LTD., Seoul (KR)

(72) Inventor: Youngchang Jo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/359,768

(22) PCT Filed: Oct. 24, 2013

(86) PCT No.: PCT/KR2013/009534
§ 371 (c)(1),
(2) Date: May 21, 2014

(87) PCT Pub. No.: WO2014/065614
PCT Pub. Date: May 1, 2014

(65) Prior Publication Data
US 2015/0046107 A1     Feb. 12, 2015

(30) Foreign Application Priority Data
Oct. 26, 2012    (KR) .................... 10-2012-0119709

(51) Int. Cl.
*G01R 31/36*     (2006.01)
*G06F 17/40*     (2006.01)
*G06F 19/00*     (2011.01)

(52) U.S. Cl.
CPC ........ *G01R 31/3606* (2013.01); *G01R 31/3648* (2013.01); *G01R 31/3651* (2013.01); *G06F 17/40* (2013.01); *G06F 19/00* (2013.01)

(58) Field of Classification Search
CPC ........... G01D 7/00; G01D 9/00; G01D 21/00; G01R 29/00; G01R 29/24; G01R 31/00; G01R 31/36; G01R 31/3606; G06F 11/00; G06F 11/30; G06F 11/32; G06F 11/34; G06F 15/00; G06F 15/16; G06F 17/00; G06F 17/10; G06F 17/40; G06F 19/00; G08B 21/00; H01M 2200/00
USPC ........ 73/432.1, 865.8, 865.9, 866.3; 320/127, 320/128, 130, 132, 134, 135, 136; 324/425, 324/426, 432, 435, 500, 537, 764.01; 340/500, 540, 635, 636.1, 636.19; 702/1, 33, 34, 57, 60, 63, 127, 182, 702/187, 189; 708/100, 105, 200
See application file for complete search history.

(56) References Cited
U.S. PATENT DOCUMENTS 3,500,167 A * 3/1970 Dufendach et al. ........... 320/132
3,617,850 A * 11/1971 Domshy ....................... 320/134
(Continued)

FOREIGN PATENT DOCUMENTS

CN        101065876 A     10/2007
EP         2 141 898 B1     3/2011
(Continued)

OTHER PUBLICATIONS
PCT/ISA/210—International Search Report mailed on Feb. 18, 2014, issued in PCT/KR2013/009534.
(Continued)

*Primary Examiner* — Edward Cosimano
(74) *Attorney, Agent, or Firm* — Birch, Stewart, Kolasch & Birch, LLP

(57) ABSTRACT

Provided are battery SOC estimating apparatus and method. The battery SOC estimating apparatus according to the present invention includes an input/output power pattern analyzing unit which analyzes an input/output power of a battery during a predetermined time to obtain an input/output power pattern of the battery; an application status determining unit which analyzes the input/output power pattern of the battery to determine a current application status of the battery; and an SOC calculating unit which calculates an SOC of the battery using a state of charge (SOC) estimation algorithm corresponding to the current application status of the battery.

20 Claims, 4 Drawing Sheets

(56) References Cited

U.S. PATENT DOCUMENTS

| | | | |
|---|---|---|---|
| 5,578,915 A * | 11/1996 | Crouch et al. | 324/428 |
| 5,606,243 A | 2/1997 | Sakai et al. | |
| 2005/0099161 A1 | 5/2005 | Sato | |
| 2006/0097698 A1 | 5/2006 | Plett | |
| 2006/0212277 A1 | 9/2006 | Hansen et al. | |
| 2006/0276980 A1 | 12/2006 | Mizuno et al. | |
| 2010/0174499 A1 | 7/2010 | Kang et al. | |
| 2010/0280777 A1 | 11/2010 | Jin et al. | |
| 2012/0326724 A1 | 12/2012 | Park | |
| 2014/0316728 A1 * | 10/2014 | Zhong et al. | 702/63 |

FOREIGN PATENT DOCUMENTS

| | | |
|---|---|---|
| JP | 7-263034 A | 10/1995 |
| JP | 11-252702 A | 9/1999 |
| JP | 2005-143240 A | 6/2005 |
| JP | 2008-533486 A | 8/2008 |
| KR | 10-2006-0110832 A | 10/2006 |
| KR | 10-2009-0020470 A | 2/2009 |
| KR | 10-2009-0077657 A | 7/2009 |
| KR | 10-2011-0040220 A | 4/2011 |
| KR | 10-2012-0079808 A | 7/2012 |

OTHER PUBLICATIONS

PCT/ISA/237—Written Opinion of the International Searching Authority mailed on Feb. 18, 2014 issued in PCT/KR2013/009534.
Taiwan Office Action for Appl. No. 102138689 dated Dec. 15, 2014 (w/ English translation).
Japanese Office Action for Appl. No. 2014-543438 dated Mar. 31, 2015 (w/ English translation).
Chinese Office Action for Application No. 201380004368.9 dated Feb. 4, 2016 with English translation.

* cited by examiner

APPARATUS AND METHOD FOR ESTIMATING STAGE OF CHARGE OF BATTERY

CROSS-REFERENCE TO RELATED APPLICATIONS

This application claims priority to and the benefit of Korean Patent Application No. 10-2012-0119709 filed in the Korean Intellectual Property Office on Oct. 26, 2012, the entire contents of which are incorporated herein by reference.

TECHNICAL FIELD

The present invention relates to an apparatus and a method for estimating a state of charge of a battery, and more particularly, to an apparatus and a method for estimating a state of charge of a battery which analyze an input/output power pattern of a battery for a predetermined time to determine a current application status of a battery and calculate a state of charge (SOC) of the battery using an SOC estimation algorithm corresponding to the current application status of the battery so that an estimation algorithm which is suitable for a situation when estimating the SOC of the battery is actively applied to minimize an SOC estimating error of the battery to obtain a more accurate SOC estimating value of the battery.

BACKGROUND ART

A secondary battery which has a high applicability to a product group and an electrical property such as a high energy density is widely applied not only to portable equipment, but also an electric vehicle (EV) or a hybrid vehicle (HV) which is driven by an electrical driving source or an energy storage system (ESS) or an uninterruptible power supply (UPS) system which uses a medium or large size battery used for domestic or industrial purpose.

Such a secondary battery has a primary advantage which drastically reduces the usage of a fossil fuel but does not create by-products in accordance with the usage of the energy, so that the secondary battery has drawn attention as a new energy source which is environmentally friendly and improves energy efficiency.

When the secondary battery is embodied as a battery for a portable terminal, the utilization of the secondary battery to a high capacity environment is not necessarily increased. However, the battery which is applied to the electric vehicle or an energy storage source is generally used such that a plurality of unit secondary battery cells is grouped together to increase utilization for a high capacity environment.

When such a battery, specifically, a plurality of secondary batteries alternately charged and discharged, it is required to manage the battery such that the charging and the discharging of the batteries are efficiently controlled to maintain appropriate operation status and performance.

To this end, a battery management system (BMS) which manages the status and the performance of the battery is provided. The BMS measures a current, a voltage, or a temperature of the battery to estimate a state of charge (SOC) of the battery based on the measured current, voltage, and temperature and controls the SOC so that the fuel consumption efficiency is the best. In order to correctly control the SOC, it is required to correctly measure the SOC of the battery which is being charged and discharged.

A method which measures an SOC of the battery in the BMS of the related art includes a method which accumulates a charged/discharged current which flows in the battery to estimate an SOC of the battery. However, according to this method, an error which is generated when a current is measured by a current sensor is continuously accumulated so that an accuracy of the SOC is lowered as time goes by.

Alternatively, there is a method which measures a voltage of a battery while charging/discharging the battery, estimates an open loop voltage (OCV) of the battery in a non-loaded status from the measured voltage and maps the SOC corresponding to the estimated open loop voltage referring to an SOC table for every open loop voltage. However, the voltage which is measured while charging or discharging the battery is largely different from an actual voltage. For example, when the battery is connected to a load to start discharging the battery, the voltage of the battery is suddenly lowered and when the charging of the battery is started from an external power source, the voltage of the battery is suddenly increased. Accordingly, an accuracy of the SOC may be lowered due to an error between the voltage measured at the time of charging/discharging the battery and the actual voltage.

SUMMARY OF THE INVENTION

The present invention has been made in an effort to provide an apparatus and a method for estimating a state of charge of a battery which analyze an input/output power pattern of a battery for a predetermined time to determine a current application status of a battery and calculate an SOC of the battery using an SOC estimation algorithm corresponding to the current application status of the battery so that when the SOC of the battery is estimated, an estimation algorithm which is suitable for a situation is actively applied to minimize an SOC estimating error of the battery to obtain a more exact SOC estimating value of the battery.

An exemplary embodiment of the present invention provides a battery SOC estimating apparatus including: an input/output power pattern analyzing unit which analyzes an input/output power of a battery during a predetermined time to obtain an input/output power pattern of the battery; an application status determining unit which analyzes the input/output power pattern of the battery to determine a current application status of the battery; and an SOC calculating unit which calculates an SOC of the battery using a state of charge (SOC) estimation algorithm corresponding to the current application status of the battery.

The input/output power pattern may include a short-term input/output power pattern and a long-term input/output power pattern. In this case, the input/output power pattern analyzing unit may include a short-term input/output power pattern analyzing unit which analyzes an input/output power of a battery during a first setting time to obtain a short-term input/output power pattern of the battery; and a long-term input/output power pattern analyzing unit which analyzes an input/output power of the battery during a second setting time which is longer than the first setting time to obtain a long-term input/output power pattern of the battery.

The SOC estimation algorithm may include an extended Kaman filter (EKF) SOC estimation algorithm or a smart SOC moving estimation (SSME) algorithm.

The current application status of the battery may include one or more of a constant current (CC) status, a photovoltaic (PV) status, a frequency regulation (FR) status, and a peak shaving (PS) status.

When the current application status of the battery is the CC status or the PV status, the SOC calculating unit may calculate the SOC of the battery using the EKF SOC estimation algorithm.

When the current application status of the battery is the FR status or the PS status, the SOC calculating unit may calculate the SOC of the battery using the SSME algorithm.

When a depth of discharge (DOD) of the input/output power pattern of the battery is a predetermined reference value or higher, the SOC calculating unit may calculate the SOC of the battery using the EKF SOC estimation algorithm.

When the DOD of the input/output power pattern of the battery is lower than a predetermined reference value, the SOC calculating unit may calculate the SOC of the battery using the SSME algorithm.

The battery SOC estimating apparatus may further include a current sensor checking unit which checks whether a current sensor which measures a value of a current which is input/output to/from the battery is provided or the current sensor normally operates.

If the current sensor checking unit determines that no current sensor is provided or the current sensor abnormally operates, the SOC calculating unit may calculate the SOC of the battery using the SSME algorithm.

Another exemplary embodiment of the present invention provides a battery SOC estimating method including: obtaining an input/output power pattern of the battery by analyzing an input/output power of a battery during a predetermined time; determining a current application status of the battery by analyzing the input/output power pattern of the battery; and calculating an SOC of the battery using the SOC estimation algorithm corresponding to the current application status of the battery.

The input/output power pattern may include a short-term input/output power pattern and a long-term input/output power pattern. In this case, the obtaining of an input/output power pattern of a battery may include obtaining a short-term input/output power pattern of the battery by analyzing an input/output power of a battery during a first setting time; and obtaining a long-term input/output power pattern of the battery by analyzing an input/output power of the battery during a second setting time which is longer than the first setting time.

The SOC estimation algorithm may include an EKF SOC estimation algorithm or an SSME algorithm.

The current application status of the battery may include one or more of a constant current (CC) status, a photovoltaic (PV) status, a frequency regulation (FR) status, and a peak shaving (PS) status.

When the current application status of the battery is the CC status or the PV status, the calculating of an SOC of the battery may include calculating the SOC of the battery using the EKF SOC estimation algorithm.

When the current application status of the battery is the FR status or the PS status, the calculating of an SOC of the battery may include calculating the SOC of the battery using the SSME algorithm.

When a depth of discharge (DOD) of the input/output power pattern of the battery is a predetermined reference value or higher, the calculating of an SOC of the battery may include calculating the SOC of the battery using the EKF SOC estimation algorithm.

When the DOD of the input/output power pattern of the battery is lower than a predetermined reference value, the calculating of an SOC of the battery may include calculating the SOC of the battery using the SSME algorithm.

The battery SOC estimating method may further include checking whether a current sensor which measures a value of a current which is input/output to/from the battery is provided or the current sensor normally operates.

If it is determined that no current sensor is provided or the current sensor abnormally operates in the checking whether a current sensor is provided, the calculating of an SOC of the battery may include calculating the SOC of the battery using the SSME algorithm.

According to an aspect of the present invention, it is possible to provide an apparatus and a method for estimating a state of charge of a battery which analyze an input/output power pattern of a battery for a predetermined time to determine a current application status of a battery and calculate an SOC of the battery using an SOC estimation algorithm corresponding to the current application status of the battery so that an estimation algorithm which is suitable for a situation when estimating the SOC of the battery is actively applied to minimize an SOC estimating error of the battery to obtain a more exact SOC estimating value of the battery.

DETAILED DESCRIPTION

The present invention will be described in detail below with reference to the accompanying drawings. Herein, repeated description and the detailed description of a known function and configuration that may make the purpose of the present invention unnecessarily ambiguous will be omitted. Exemplary embodiments of the present invention are provided so that those skilled in the art may more completely understand the present invention. Accordingly, the shape, the size, etc., of elements in the figures may be exaggerated for explicit comprehension.

In the specification, unless explicitly described to the contrary, the word "comprise" and variations such as "comprises" or "comprising", will be understood to imply the inclusion of stated elements but not the exclusion of any other elements.

The term "-unit" described in the specification means a unit for processing at least one function and operation and can be implemented by hardware components or software components or combinations thereof.

An electric vehicle which will be described below refers to a vehicle which includes one or more electric motors in order to obtain momentum. An energy which is used to drive the electric vehicle includes an electric source such as a rechargeable battery and/or a fuel cell. The electric vehicle may be a hybrid electric vehicle which uses an internal combustion engine as another power source.

Figure 1:
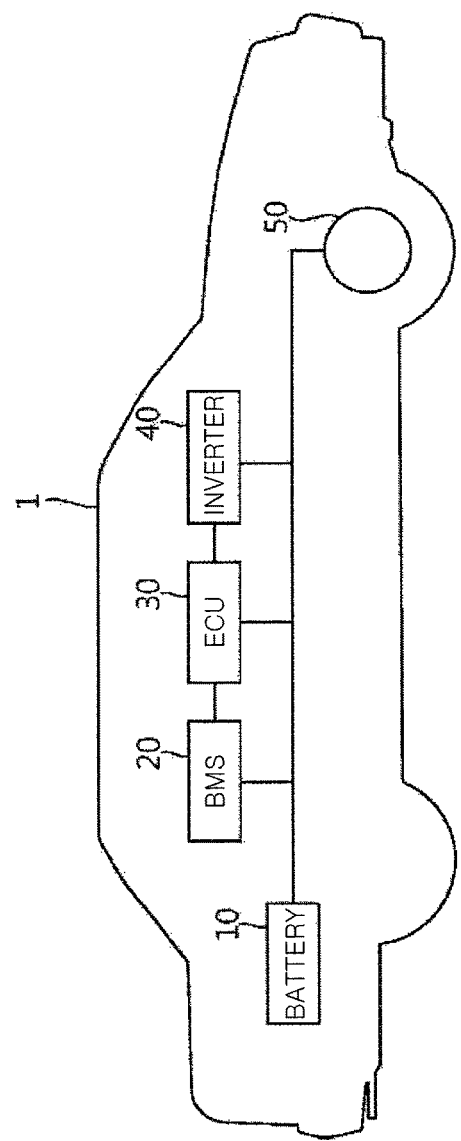
FIG. 1 is a diagram schematically illustrating an electric vehicle to which a battery SOC estimating apparatus according to an exemplary embodiment of the present invention is applied.

FIG. 1 is a diagram schematically illustrating an electric vehicle to which a battery SOC estimating apparatus according to an exemplary embodiment of the present invention is applied.

FIG. 1 illustrates an example in which a battery SOC estimating apparatus according to an exemplary embodiment of the present invention is applied to an electric vehicle. However, the battery SOC estimating apparatus according to an exemplary embodiment of the present invention may be applied to any technical fields such as a domestic or industrial energy storage system (ESS) or an uninterruptible power supply (UPS) system, if a secondary cell is applied thereto, other than the electric vehicle.

The electric vehicle 1 may include a battery 10, a battery management system (BMS) 20, an electronic control unit (ECU) 30, an inverter 40, and a motor 50.

The battery 10 is an electric energy source which supplies a driving force to the motor 50 to drive the electric vehicle 1. The battery 10 may be charged or discharged by the inverter 40 in accordance with the driving of the motor 50 and/or an internal combustion engine (not illustrated).

Here, a type of the battery 10 is not specifically limited, and for example, the battery 10 may be configured by a lithium ion battery, a lithium polymer battery, a nickel cadmium battery, a nickel hydrogen battery, or a nickel zinc battery.

The battery 10 is formed of a battery pack in which a plurality of battery cells are connected in series and/or parallel. One or more battery packs are provided to form the battery 10.

The BMS 20 estimates a state of the battery 10 and manages the battery 10 using estimated state information. For example, the BMS 20 estimates and manages state information of the battery 10 such as a state of charge (SOC), a state of health (SOH), a maximum input/output power capability, or an output voltage of the battery. The BMS 20 controls charging or discharging of the battery 10 using the state information and further may also estimate a time to replace the battery 10.

The BMS 20 according to the present invention may include a battery SOC estimating apparatus (100 of FIG. 2) which will be described below. Accuracy and reliability of estimating the SOC of the battery 10 may be improved using the battery SOC estimating apparatus.

The ECU 30 is an electronic control device which controls a status of the electric vehicle 1. For example, the ECU 30 determines a degree of torque based on information such as an accelerator, a break, or a speed and controls an output of the motor 50 so as to comply with torque information.

The ECU 30 sends a control signal to the inverter 40 so that the battery 10 is charged or discharged based on the state information such as SOC or SOH of the battery 10 which is transmitted from the BMS 20.

The inverter 40 charges and discharges the battery 10 based on the control signal of the ECU 30.

The motor 50 drives the electric vehicle 1 using an electric energy of the battery 10, based on the control information (for example, torque information) which is transmitted from the ECU 30.

The electric vehicle 1 is driven using the electric energy of the battery 10 so that it is important to accurately estimate the state (for example, the SOC) of the battery 10.

Accordingly, battery SOC estimating apparatus and method according to an exemplary embodiment of the present invention will be described below with reference to FIGS. 2 to 6.

Figure 2:
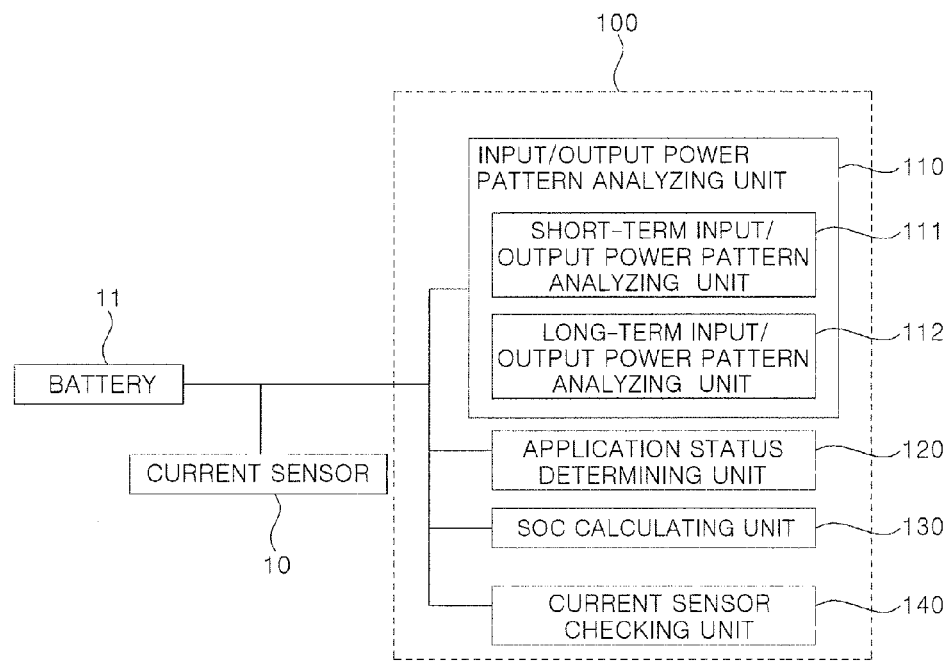
FIG. 2 is a diagram schematically illustrating a battery SOC estimating apparatus according to an exemplary embodiment of the present invention.

FIG. 2 is a diagram schematically illustrating a battery SOC estimating apparatus according to an exemplary embodiment of the present invention.

Referring to FIG. 2, a battery SOC estimating apparatus 100 according to an exemplary embodiment of the present invention is connected to a battery 10 to estimate an SOC of the battery 10. The battery SOC estimating apparatus 100 according to the exemplary embodiment of the present invention may be included in at least one of a battery management system (BMS), a power monitoring system (for example, a remote supervisory control and data acquisition (SCADA) system), a user terminal, and a charger/discharger, which are connected to the battery 10, or may be embodied as a BMS, a power monitoring system, a user terminal, and a charger/discharger.

The battery SOC estimating apparatus 100 according to the exemplary embodiment of the present invention may include an input/output power pattern analyzing unit 110, an application status determining unit 120, an SOC calculating unit 130, and a current sensor checking unit 140. The battery SOC estimating apparatus 100 illustrated in FIG. 2 is an exemplary embodiment but constituent elements thereof are not limited to the exemplary embodiment illustrated in FIG. 2 and some constituent elements may be added, modified, or deleted if necessary.

The input/output power pattern analyzing unit 110 analyzes an input/output power of the battery 10 for a predetermined time to obtain an input/output power pattern of the battery 10. The input/output power pattern may be a pattern having a high depth of discharge (DOD) in which a process of being charged at a predetermined level or higher and discharged at a predetermined level or lower continuously occurs or a pattern having a low depth of discharge in which a process of being repeated alternately above and below a specific SOC occurs.

The above-mentioned input/output power pattern may include a short-term input/output power pattern and a long-term input/output power pattern. The input/output power pattern analyzing unit 110 may include a short-term input/output power pattern analyzing unit 111 and a long-term input/output power pattern analyzing unit 112.

The short-term input/output power pattern analyzing unit 111 analyzes an input/output power of the battery 10 for a first setting time to obtain a short-term input/output power pattern of the battery 10 and the long-term input/output power pattern analyzing unit 112 analyzes an input/output power of the battery 10 for a second setting time which is longer than the first setting time to obtain a long-term input/output power pattern of the battery 10. In this case, the first setting time and the second setting time may be set in advance as a fixed value in the battery SOC estimating apparatus 100 according to the exemplary embodiment of the present invention or input by a user. For example, the first setting time may be one minute and the second setting time may be 60 minutes.

The application status determining unit 120 analyzes the input/output power pattern of the battery 10 to determine a current application status of the battery 10. The current application status of the battery 10 means a condition where the battery 10 is currently applied and may be one or more of a constant current (CC) status, a photovoltaic (PV) status, a frequency regulation (FR) status, and a peak shaving (PS) status. The CC status refers to a status where a constant current flows in the battery 10 and the battery 10 is charged or discharged with the constant current. The PV status refers to a status where a power is photovoltaically generated in the battery 10. The FR status refers to a status where the battery 10 is used to adjust a frequency in order to maintain the frequency when a load is changed. The PS status refers to a status where the battery 10 is used to supply an emergency power in order to shave a peak load during a peak time of the system.

Generally, in the CC status or the PV status, a process of being charged at a predetermined level or higher and discharged at a predetermined level or lower consistently occurs so that the input/output power pattern of the battery 10 has a high DOD. Therefore, in the case of the above pattern, the application status determining unit 120 may determine the current application status of the battery 10 as a CC status or a PV status.

In the FR status or the PS status, a process of being repeated alternately above and below a specific SOC occurs so that the input/output power pattern of the battery 10 has a low depth of discharge. Therefore, in the case of this pattern, the application status determining unit 120 may determine the current application status of the battery 10 as the FR status or the PS status.

The SOC calculating unit 130 calculates the SOC of the battery 10 using an SOC estimation algorithm corresponding to the current application status of the battery 10. The SOC estimation algorithm may include an extended Kalman filter (EKF) SOC estimation algorithm or a smart SOC moving estimation (SSME) algorithm.

The EKF SOC estimation algorithm is a method which makes the battery as an electrical model and compares a theoretical output value of the battery model with an actual output value to estimate the SOC through active correction. An input value of the EKF SOC estimation algorithm is a voltage, a current, and a temperature and an output value is an SOC. The EKF SOC estimation algorithm has been widely known by plural known materials in the related art so that a specific description of how the SOC estimation is performed in the EKF SOC estimation algorithm will be omitted.

The EKF SOC estimation algorithm has advantages in that a maximum error of the SOC is low, for example, 3% in a room temperature and the SOC estimation may be stably performed significantly regardless of the power pattern but has disadvantages in that the algorithm is sensitive to a parameter of the battery model, inevitably requires a current sensor and is sensitive to a change of the state of health (SOH) of the battery.

The SSME algorithm is a method which estimates a change of an open circuit voltage (OCV) based on a change between a previous value and a current value of a terminal measurement voltage without using a current value and estimates the SOC based on the estimated OCV. An input value of the EKF SOC estimation algorithm is a voltage and a temperature and an output value is an SOC. Hereinafter, the SSME algorithm will be described with reference to FIGS. 3 to 5.

Figure 3:
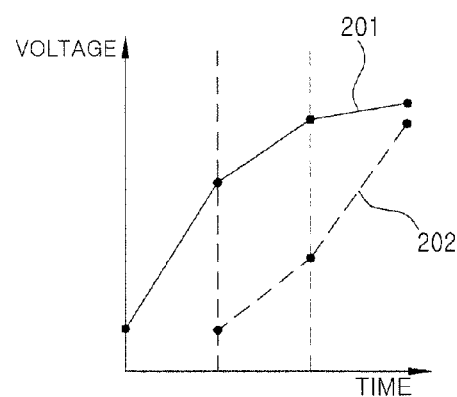
FIGS. 3 to 5 are diagrams illustrating an SSME algorithm which is used for a battery SOC estimating apparatus according to an exemplary embodiment of the present invention.
Figure 4:
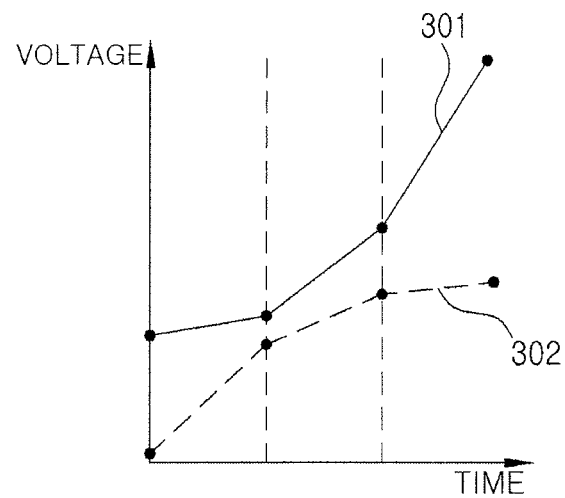
Figure 5:
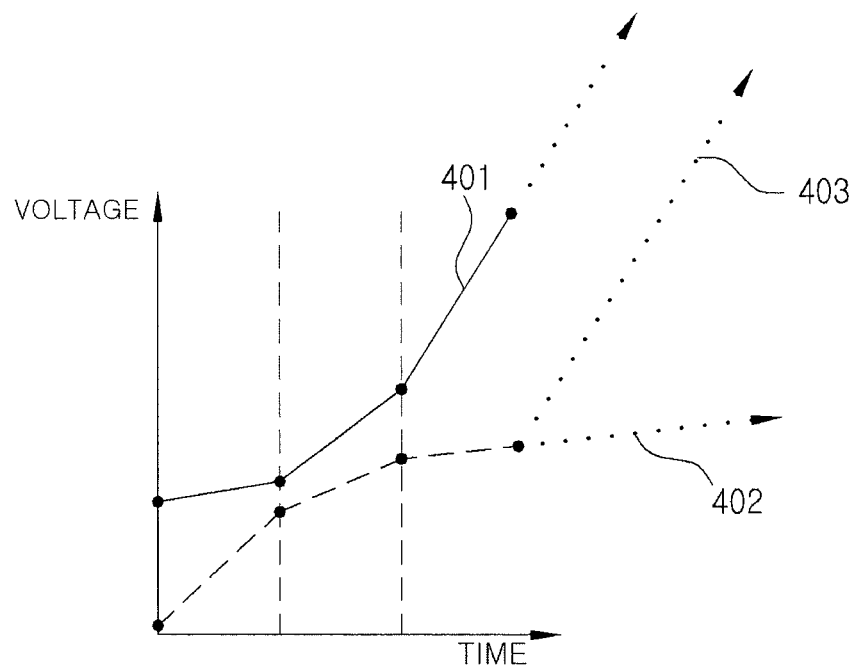

FIGS. 3 to 5 are diagrams illustrating an SSME algorithm which is used for a battery SOC estimating apparatus according to an exemplary embodiment of the present invention.

FIGS. 3 and 4 are diagrams illustrating a method of estimating a change of an OCV in accordance with two voltage patterns.

Referring to FIG. 3, a curve of a measured voltage value 201 is converged as time goes by. In this case, an actual OCV is highly likely to be a converged voltage value so that the SSME algorithm makes an estimated OCV value 202 rapidly approach a measured voltage value 201.

Referring to FIG. 4, a curve of a measured voltage value 301 is diverged while the slope is increased as time goes by. This case may be highly likely to be a case when the voltage is bounced due to a high transient current so that the measured OCV value 301 may gradually follow the estimated OCV value 302 if possible.

FIG. 5 is a diagram illustrating a solving method of the SSME algorithm for a problem which may occur during the OCV estimation by two types of voltage patterns illustrated in FIGS. 3 and 4.

In the case of the voltage pattern in which a curve of the measured voltage value 401 is diverged with an increased slope as time goes by, if the voltage is not temporarily diverged as described with reference to FIG. 4 but consistently diverged, the estimated OCV value cannot follow the measured voltage value 401 when it is required like the curve 402 so that an error may be increased. Therefore, in the SSME algorithm, a correction factor in accordance with a moving average is used. That is, when a difference between the moving average value and the estimated OCV value is larger than a predetermined level, a curve 403 is created using the correction factor such that the estimated OCV value follows the measured voltage value 401 regardless of the voltage pattern.

The SSME algorithm has advantages in that no current sensor is required and the errors are not accumulated but has disadvantages in that accuracy is low in a linear power pattern and the maximum error of the SOC is 5% at the room temperature which is a little bit higher than that of the EKF SOC estimation algorithm.

The SOC estimation algorithms described above have distinct advantages and disadvantages so that it is difficult to conclude which one is better than the other. SOC accuracy of the SOC estimation algorithms may vary depending on the input/output power pattern of the battery 10. Therefore, the SOC calculating unit 130 calculates the SOC of the battery 10 using an appropriate SOC estimating algorithm corresponding to the current application status of the battery 10 to increase the accuracy of the SOC.

In one exemplary embodiment, when the current application status of the battery 10 is the CC status or the PV status, the SOC calculating unit 130 may calculate the SOC of the battery 10 using the EKF SOC estimation algorithm. When the current application status of the battery 10 is the CC status or the PV status, a constant current flows in the battery 10 so that the linear power pattern may be shown. Therefore, if the EKF SOC estimation algorithm is used rather than the SSME algorithm, a more accurate SOC may be calculated. Most of the application status of the battery 10 may show a linear power pattern except for the FR status or the PS status so that the EKF SOC estimation algorithm may be applied in the most of the current application status of the battery 10.

When the current application status of the battery 10 is the FR status or the PS status, the SOC calculating unit 130 may calculate the SOC of the battery 10 using the SSME algorithm. When the current application status of the battery 10 is the FR status or the PS status, a current repeatedly flows in the battery 10 to be alternately high and low so that a non-linear power pattern may be shown. Therefore, if the SSME algorithm is used rather than the EKF SOC estimation algorithm, a more accurate SOC may be calculated.

In another exemplary embodiment, when a depth of discharge (DOD) of the input/output power pattern of the battery 10 is a predetermined reference value or higher, the SOC calculating unit 130 may calculate the SOC of the battery 10 using the EKF SOC estimation algorithm. When the DOD of the battery 10 is high, a process of being charged at a predetermined level or higher and discharged at a predetermined level or lower consistently occurs, which may show a linear power pattern. Accordingly, when the EKF SOC estimation algorithm is used instead of the SSME algorithm, a more accurate SOC may be calculated. The predetermined reference value may be set in advance in the SOC calculating unit 130 as a fixed value or input by a user.

When the DOD of the input/output power pattern of the battery 10 is below the predetermined reference value, the SOC calculating unit 130 may calculate the SOC of the battery 10 using the SSME algorithm. When the DOD of the battery 10 is low, the power pattern is repeated alternately above and below a specific SOC, which may show a non-linear power pattern. Accordingly, when the SSME algorithm is used instead of the EKF SOC estimation algorithm, a more accurate SOC may be calculated.

The current sensor checking unit 140 checks whether a current sensor 11 which measures a value of a current which is input/output to/from the battery 10 is provided or the current sensor 11 normally operates.

As a checking result in the current sensor checking unit 140, if it is determined that no current sensor 11 is provided or the current sensor 11 abnormally operates, the SOC calculating unit 130 directly uses the SSME algorithm to calculate the SOC of the battery 10. This is because the SSME algorithm does not require the current value so that no current sensor 11 is required.

Figure 6:
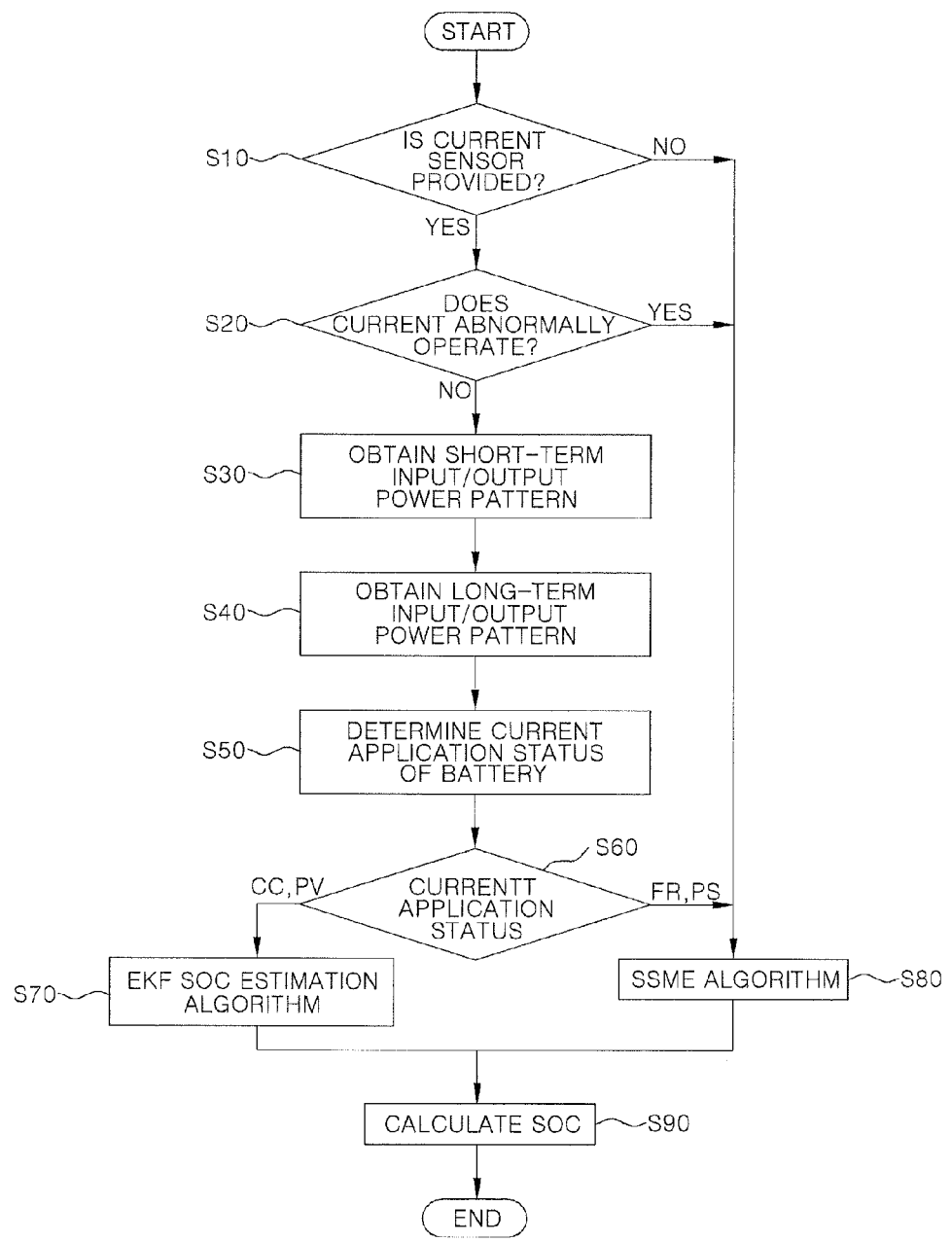
FIG. 6 is a flowchart illustrating a battery SOC estimating method according to an exemplary embodiment of the present invention.

FIG. 6 is a flowchart illustrating a battery SOC estimating method according town exemplary embodiment of the present invention.

Referring to FIG. 6, when the battery SOC estimating method according to an exemplary embodiment of the present invention starts, first, it is checked whether a current sensor is provided in S10 and the current sensor normally operates in S20. If it is determined that no current sensor is provided or the current sensor abnormally operates, the SSME algorithm is immediately used in S80 to calculate an SOC in step S90.

If it is determined that the current sensor is provided and normally operates, an input/output power of the battery during a predetermined time is analyzed to obtain an input/output power pattern of the battery. The input/output power pattern includes a short-term input/output power pattern and a long-term input/output power pattern. A process of obtaining the input/output power pattern of the battery may include a step of analyzing the input/output power of the battery for a first setting time to obtain the short-term input/output power pattern of the battery (S30) and a step of analyzing the input/output power of the battery for a second setting time which is longer than the first setting time to obtain the long-term input/output power pattern of the battery (S40).

Next, the input/output power pattern of the battery is analyzed to determine a current application status of the battery in S50.

Next, an SOC estimation algorithm corresponding to the current application status of the battery is used to calculate the SOC of the battery in steps S60, S70, S80, and S90.

For example, when the current application status (S60) of the battery is a CC status or a PV status, the EKF SOC estimation algorithm (S70) is used to calculate the SOC of the battery in step S90 and when the current application status (S60) of the battery is an FR status or a PS status, the SSME algorithm (S80) is used to calculate the SOC of the battery in step S90.

The above-described battery SOC estimating method has been described with reference to the flowchart illustrated in the drawing. In order to simply describe the present invention, the method has been described with reference to a series of block diagrams but the present invention is not limited to the order of the blocks and processes of some blocks may be performed in a different order from the order of the blocks illustrated and described in the specification or simultaneously performed with other blocks. Various different divergences, flow paths, and orders of the blocks which may achieve the same or similar result may be implemented. All blocks which have been illustrated may not be required to implement the method described in the specification.

While a specific embodiment of the present invention has been illustrated and described, it is obvious to those skilled in the art that the technical spirit of the present invention is not limited to the accompanying drawings and the above description and various modifications may be made without departing from the scope of the present invention. It is understood that such a modification will be covered by the claims of the present invention within the spirit of the present invention.

What is claimed is:

1. A battery state of charging estimating apparatus, comprising:
   an input/output power pattern analyzing unit which analyzes an input/output power of a battery during a predetermined time to obtain an input/output power pattern of the battery;
   an application status determining unit which analyzes the input/output power pattern of the battery to determine a current application status of the battery;
   an SOC calculating unit which calculates an SOC of the battery using a state of charging (SOC) estimation algorithm corresponding to the current application status of the battery; and
   a battery management system receiving the SOC of the battery from the SOC calculating unit and managing the status and performance of the battery based on the SOC of the battery.

2. The apparatus of claim 1, wherein the input/output power pattern includes a short-term input/output power pattern and a long-term input/output power pattern, and
   the input/output power pattern analyzing unit includes a short-term input/output power pattern analyzing unit which analyzes an input/output power of a battery during a first setting time to obtain a short-term input/output power pattern of the battery; and
   a long-term input/output power pattern analyzing unit which analyzes an input/output power of the battery during a second setting time which is longer than the first setting time to obtain a long-term input/output power pattern of the battery.

3. The apparatus of claim 1, wherein the SOC estimation algorithm includes an extended Kaman filter (EKF) SOC estimation algorithm or a smart SOC moving estimation (SSME) algorithm.

4. The apparatus of claim 3, wherein when a depth of discharge (DOD) of the input/output power pattern of the battery is a predetermined reference value or higher, the SOC calculating unit calculates the SOC of the battery using the EKF SOC estimation algorithm.

5. The apparatus of claim 3, wherein when the DOD of the input/output power pattern of the battery is lower than a predetermined reference value, the SOC calculating unit calculates the SOC of the battery using the SSME algorithm.

6. The apparatus of claim 3, further comprising:
   a current sensor checking unit which checks whether a current sensor which measures a value of a current which is input/output to/from the battery is provided or the current sensor normally operates.

7. The apparatus of claim 6, wherein if the current sensor checking unit determines that no current sensor is provided or the current sensor abnormally operates, the SOC calculating unit calculates the SOC of the battery using the SSME algorithm.

8. The apparatus of claim 3, wherein the current application status of the battery includes one or more of a constant current (CC) status, a photovoltaic (PV) status, a frequency regulation (FR) status, and a peak shaving (PS) status.

9. The apparatus of claim 8, wherein when the current application status of the battery is the CC status or the PV status, the SOC calculating unit calculates the SOC of the battery using the EKF SOC estimation algorithm.

10. The apparatus of claim 8, wherein when the current application status of the battery is the FR status or the PS status, the SOC calculating unit calculates the SOC of the battery using the SSME algorithm.

11. A battery state of charging estimating method, comprising:
- obtaining an input/output power pattern of a battery by analyzing an input/output power of the battery during a predetermined time;
- determining a current application status of the battery by analyzing the input/output power pattern of the battery;
- calculating a state of charging (SOC) of the battery using an SOC estimation algorithm corresponding to the current application status of the battery; and
- managing the status and performance of the battery with a battery management system based on the SOC of the battery received from the SOC calculating unit.

12. The method of claim 11, wherein the input/output power pattern includes a short-term input/output power pattern and a long-term input/output power pattern, and
the obtaining of an input/output power pattern of a battery includes:
- obtaining a short-term input/output power pattern of the battery by analyzing an input/output power of a battery during a first setting time; and
- obtaining a long-term input/output power pattern of the battery by analyzing an input/output power of the battery during a second setting time which is longer than the first setting time.

13. The method of claim 11, wherein the SOC estimation algorithm includes an extended Kaman filter (EKF) SOC estimation algorithm or a smart SOC moving estimation (SSME) algorithm.

14. The method of claim 13, wherein when a depth of discharge (DOD) of the input/output power pattern of the battery is a predetermined reference value or higher, the calculating of an SOC of the battery includes calculating the SOC of the battery using the EKF SOC estimation algorithm.

15. The method of claim 13, wherein when the DOD of the input/output power pattern of the battery is lower than a predetermined reference value, the calculating of an SOC of the battery includes calculating the SOC of the battery using the SSME algorithm.

16. The method of claim 13, further comprising:
- checking whether a current sensor which measures a value of a current which is input/output to/from the battery is provided or the current sensor normally operates.

17. The method of claim 16, wherein if it is determined that no current sensor is provided or the current sensor abnormally operates in the checking whether a current sensor is provided, the calculating of an SOC of the battery includes calculating the SOC of the battery using the SSME algorithm.

18. The method of claim 13, wherein the current application status of the battery includes one or more of a constant current (CC) status, a photovoltaic (PV) status, a frequency regulation (FR) status, and a peak shaving (PS) status.

19. The method of claim 18, wherein when the current application status of the battery is the CC status or the PV status, the calculating of an SOC of the battery includes calculating the SOC of the battery using the EKF SOC estimation algorithm.

20. The method of claim 18, wherein when the current application status of the battery is the FR status or the PS status, the calculating of an SOC of the battery includes calculating the SOC of the battery using the SSME algorithm.

* * * * *